United States Patent [19]
Inoue

[11] Patent Number: 6,072,981
[45] Date of Patent: Jun. 6, 2000

[54] MULTI-TAP DISTRIBUTION APPARATUS

[75] Inventor: Nobutaka Inoue, Nisshin, Japan

[73] Assignee: Maspro Denkoh Company, Ltd., Aichi, Japan

[21] Appl. No.: 08/817,820

[22] PCT Filed: Jul. 24, 1996

[86] PCT No.: PCT/JP96/02109

§ 371 Date: May 1, 1997

§ 102(e) Date: May 1, 1997

[87] PCT Pub. No.: WO97/13322

PCT Pub. Date: Apr. 10, 1997

[30] Foreign Application Priority Data

Sep. 30, 1995 [JP] Japan ................................ 7-276303

[51] Int. Cl.[7] .................................................. H01R 13/15
[52] U.S. Cl. ...................... 455/3.1; 174/35 R; 361/826; 439/63; 348/6
[58] Field of Search ........................... 455/3.1, 3.3, 6.1, 455/51; 348/6, 10; 439/263, 727, 76.1, 728, 535, 579, 578, 574, 581, 63, 36; 333/124, 125, 126, 131, 136, 260; 361/800, 816, 818, 826; 174/35 R, 35 C

[56] References Cited

U.S. PATENT DOCUMENTS

| | | | |
|---|---|---|---|
| 4,963,966 | 10/1990 | Harney et al. | 358/349 |
| 5,194,947 | 3/1993 | Lowcock et al. | 348/6 |
| 5,547,400 | 8/1996 | Wright | 439/63 |
| 5,631,443 | 5/1997 | Scrimpshire et al. | 174/35 R |
| 5,657,385 | 8/1997 | Reichle | 439/63 |
| 5,828,272 | 10/1998 | Romerin et al. | 333/10 |
| 5,833,481 | 10/1998 | Inoue | 439/263 |
| 5,892,653 | 4/1999 | Nishimuta et al. | 361/643 |

FOREIGN PATENT DOCUMENTS

| | | |
|---|---|---|
| 48-418866 | of 1973 | Japan . |
| 50-73512 | of 1975 | Japan . |
| 52-55962 | of 1977 | Japan . |
| 53-15233 | of 1978 | Japan . |
| 53-17724 | of 1978 | Japan . |
| 53-34818 | of 1978 | Japan . |
| 54-122020 | of 1979 | Japan . |
| 62-196435 | of 1987 | Japan . |
| 418231 | of 1992 | Japan . |

*Primary Examiner*—Andrew I. Faile
*Assistant Examiner*—Reuben Brown
*Attorney, Agent, or Firm*—Pearson & Pearson

[57] ABSTRACT

There is provided a multi-drop distribution apparatus capable of installed in small space and of allowing transmission of large currents, the distribution apparatus having the same characteristics of a coaxial cylinder. A housing (1) has on its inner wall a groove (6a) interposed between a cable connecting portion (3) and a main line connection terminal (5b). The cable connecting portion (3) and the terminal (5b) are interconnected by a conductive rod (6) disposed in the groove (6a) without being in contact with the inner wall of the groove (6a). A dielectric block (7) is penetrated by the conductive rod (6) so as to be slidable in the groove (6a).

16 Claims, 11 Drawing Sheets

¹

MULTI-TAP DISTRIBUTION APPARATUS

FIELD OF THE ART

The present invention relates to a multi-tap distribution apparatus. More particularly, the present invention relates to a multi-tap distribution apparatus which is suitable for use with CATV cables.

BACKGROUND ART

Generally, CATV transmission cables are connected to subscribers via multi-tap distribution apparatuses. CATV stations transmit through the cables not only television signals and control signals but also currents for operating main line amplifiers.

While some distribution apparatuses are not designed for passing currents, there are those designed for this purpose. The later type of distribution apparatuses are provided with a current transmission circuit either installed in the high-frequency passing route or installed as a separate circuit. The aforementioned high-frequency passing route originating in a cable connecting portion and leading to taps via a branch circuit and a distribution circuit.

In the latter type of distribution apparatus, the large currents that are conducted through the main line pass at least through the cable connecting portions, although only low ampere currents reach the taps. Therefore, it is necessary to secure sufficient capacity in the transmission line in order to minimize both the transmission loss and adverse effect on the characteristics of the electromagnetic waves.

The most effective measure would be to use a thick coaxial cylinder for the transmission line. This, however, is not a very practical measure because it takes up too much space in the distribution apparatus, leaving less space for installing other circuits. This measure also increases the number of parts, thereby increasing assembly time and cost.

DISCLOSURE OF THE INVENTION

The present invention provides for a distribution apparatus for being interposed in a transmission cable. The distribution apparatus includes a built-in mother board disposed in the approximate center of a case. The mother board includes a branch circuit for distributing as output signals high-frequency signals received at an input terminal of the mother board, and a current transmission circuit for allowing currents to be transmitted between the input terminal and an output terminal of the mother board. The input and output terminals of the mother board are electrically connected to cable connecting portions provided on one end or ends of the case by transmission lines each having a central conductor. The central conductor of each transmission line is disposed along a groove formed on the inner surface of the case without being in contact with the inner wall of the groove.

The distribution apparatus may have at least three cable connecting portions provided so that two cable connecting portions are selectable from the at least three cable connecting portions so as to be connected to the input and output terminals of the mother board.

Preferably, each of the grooves has a semi-circular cross section.

Also preferably, the central conductor of each transmission line is a conductive rod with a split tube on one end thereof. The split tube may have a connector pin inserted therein and being fixed, together with the connector pin, in the cable connecting portion.

In a preferred mode, the distribution apparatus includes a dielectric block interposed between each of the transmission lines and the corresponding groove. The dielectric block occupies part of the groove so as to be movable along the groove or to be fixed in a predetermined position in the groove.

BEST MODE FOR CARRYING OUT THE INVENTION

A multi-tap distribution apparatus embodying the present invention will be explained with reference to the attached drawings. The multi-tap distribution apparatus of the embodiment is provided with three cable connecting portions so as to be used as either an aerial type or pedestal type device. Also, the number of taps can be changed in the distribution apparatus of this embodiment.

Figure 1:
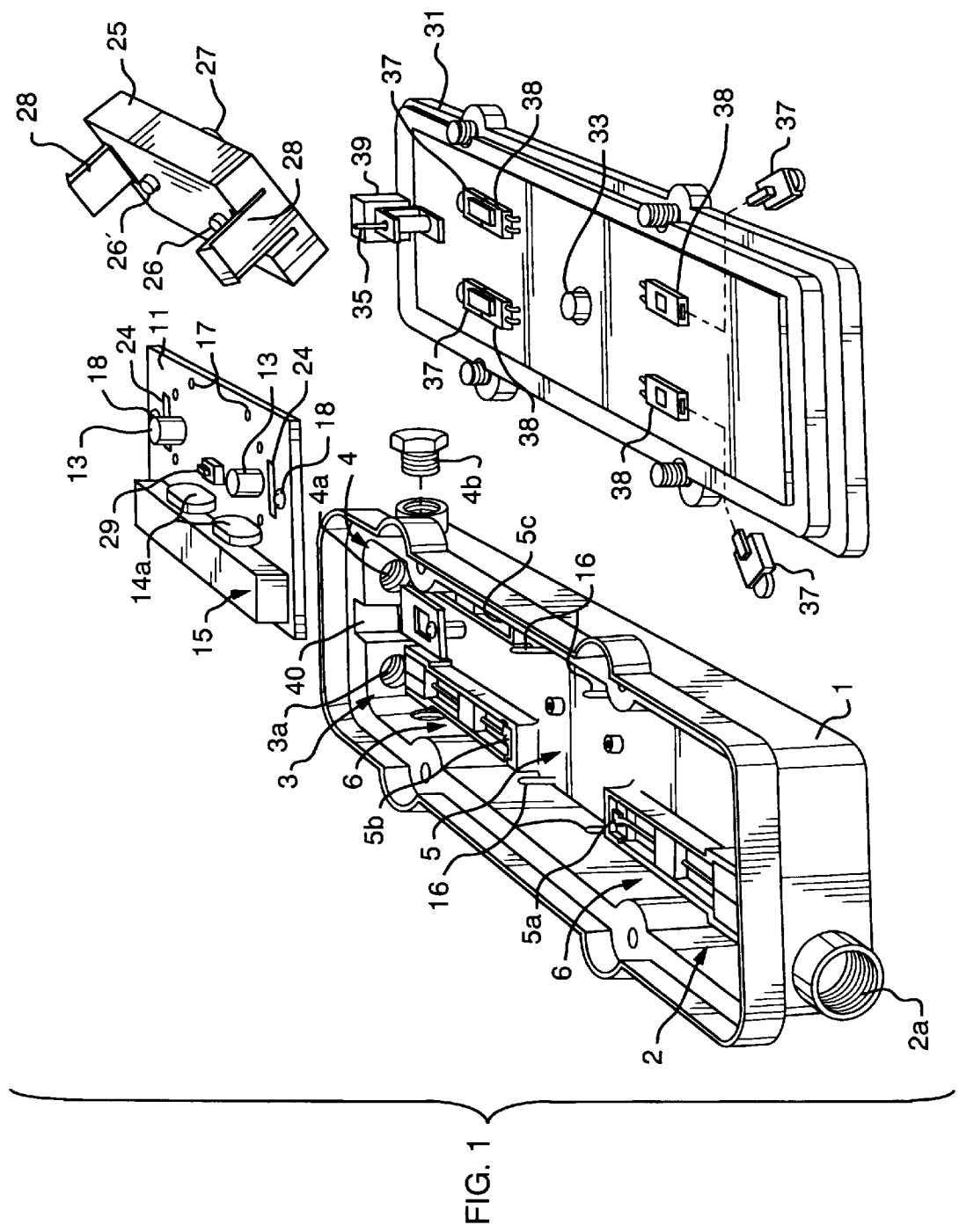
FIG. 1 is an exploded perspective view of a multi-tap distribution apparatus of an embodiment of the present invention.
Figure 2:
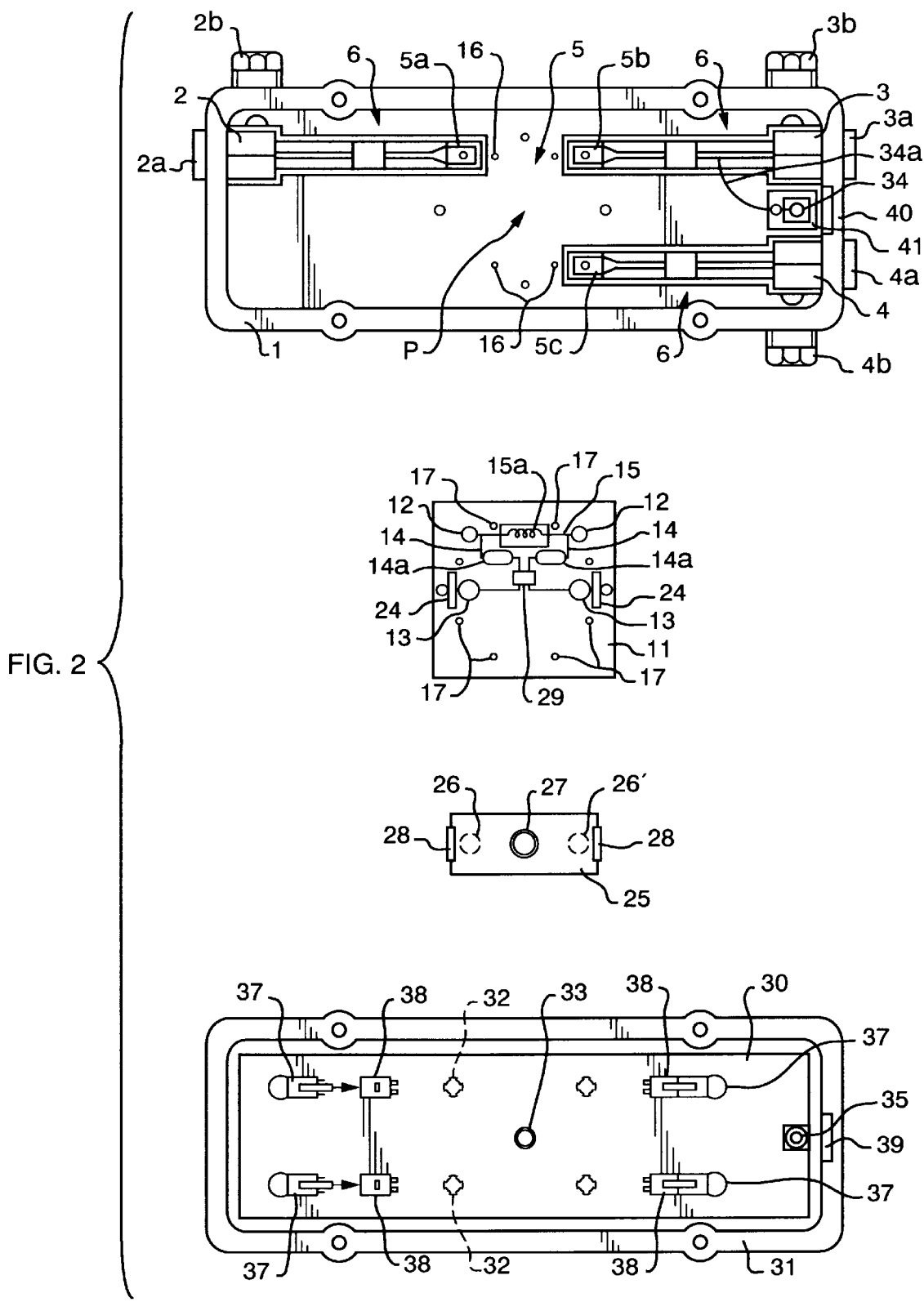
FIG. 2 shows a plan view of the components of the multi-tap distribution apparatus.
Figure 3:
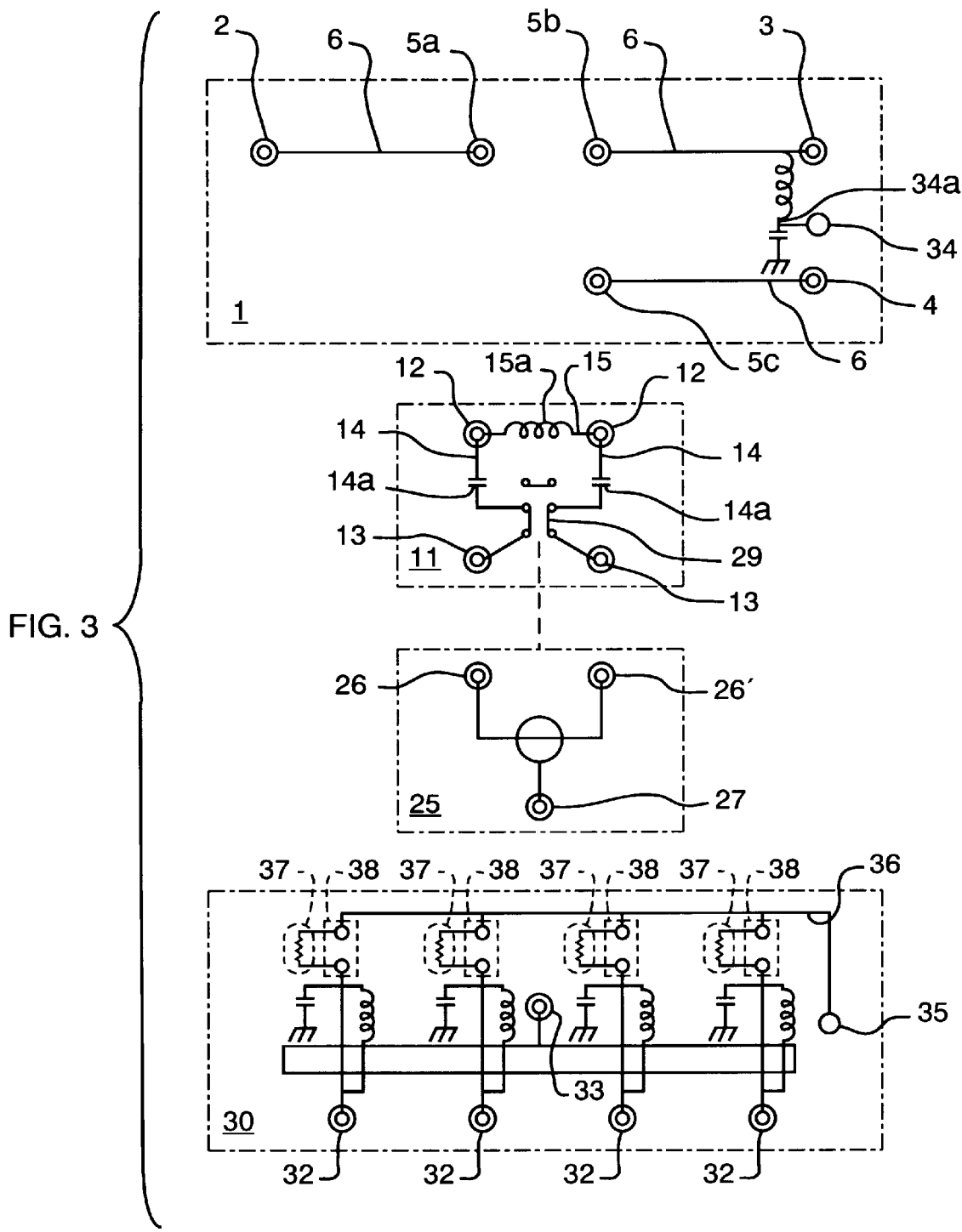
FIG. 3 shows a circuit diagram of the components of the multi-tap distribution apparatus.

Referring to FIGS. 1 to 3, numeral 1 designates a box-shaped housing made of die-cast aluminum with one side open. The housing 1 (one of the two components forming the entire case) is provided with one cable connecting portion 2 on one end surface and two other cable connecting portions 3 and 4 on the opposite end surface. Each of the cable connecting portions 2, 3, and 4 is disposed on a corner of the housing 1. Connector insertion holes 2a, 3a, and 4a are provided in the end surfaces while three screw access holes are provided in the longitudinal sides of the housing 1. The screw access holes are closed with blind bolts 2b, 3b, and 4b.

The housing 1 has in its center a circuit mounting area 5 on which three main line connection terminals 5a, 5b, and 5c are provided. The upper terminals 5a and 5b are located above, and on the right and left sides of, the center P of the housing 1 while the terminal 5c is located directly under the right terminal 5c. The terminals 5a, 5b, and 5c are connected to the respective cable connecting portions 2, 3, and 4, respectively, via transmission lines 6.

Figure 4A:
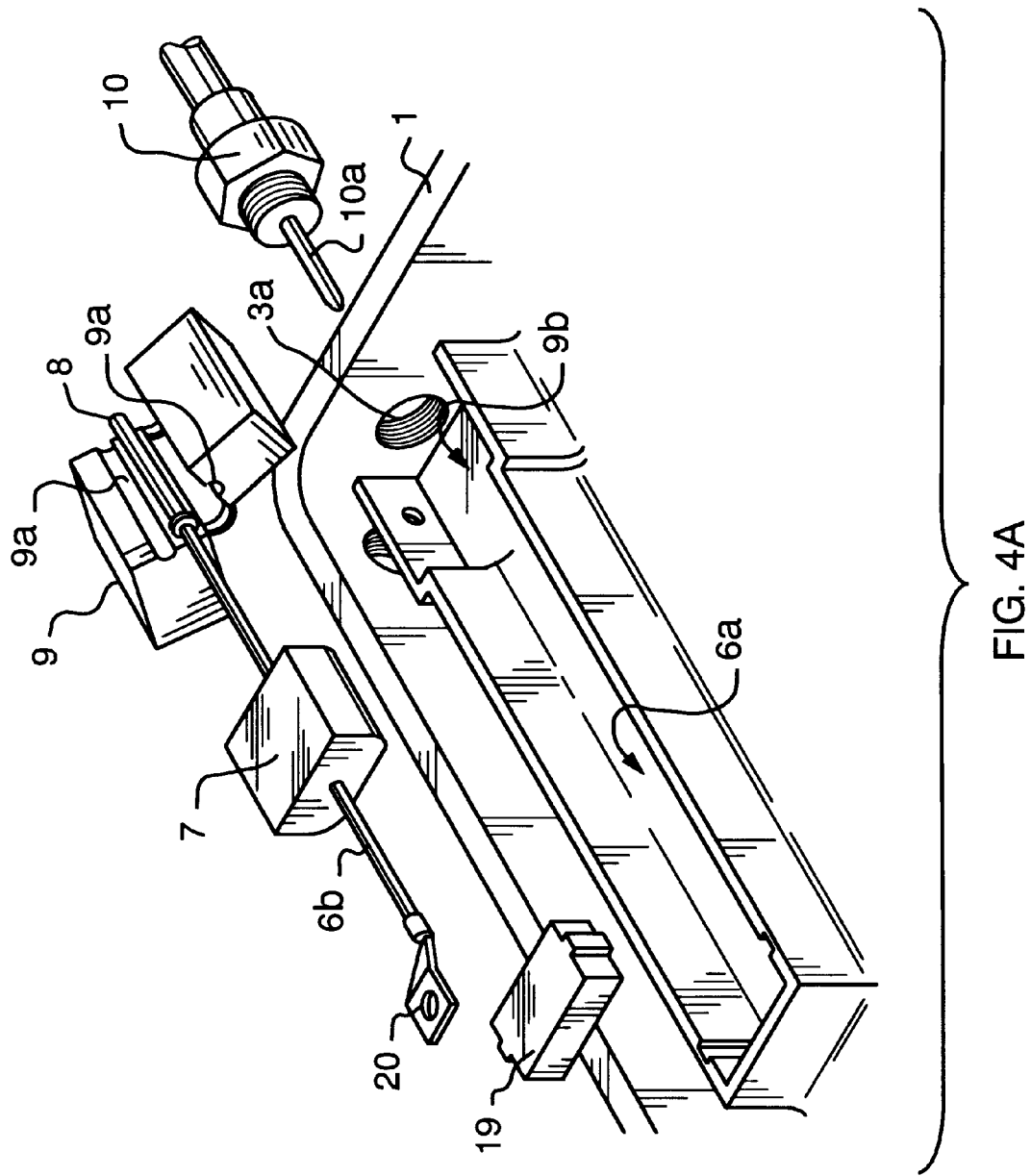
FIGS. 4A and 4B show the transmission Line of the embodiment.
Figure 4B:
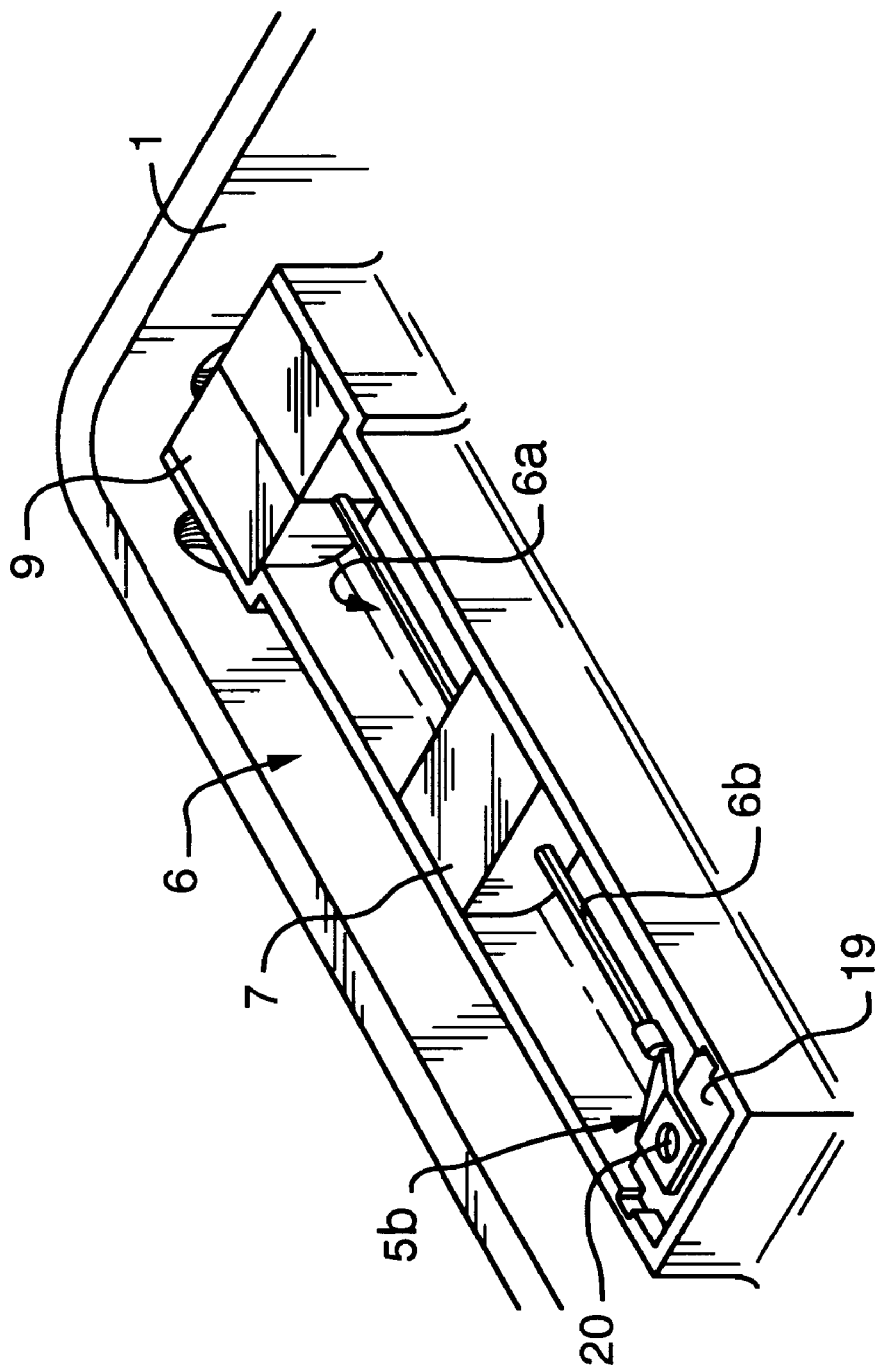

Referring to FIGS. 4A and 4B, each transmission line 6 has a coaxial structure integrally formed with the inner surface of the housing 1. The transmission line 6 includes a brass or copper conductive rod 6b disposed as the central conductor in a groove 6a without being in contact with the inner wall of the groove 6a. The groove 6a has a semicircular cross section and a shield wall erected on each side.

The transmission line 6 further includes a dielectric block 7 which is penetrated by the conductive rod 6b and mounted in the groove 6a. The dielectric block 7 has an outer shape that fits in the groove 6a and occupies part of the groove 6a so as to be slidable in the longitudinal direction of the groove 6a.

Figure 5:
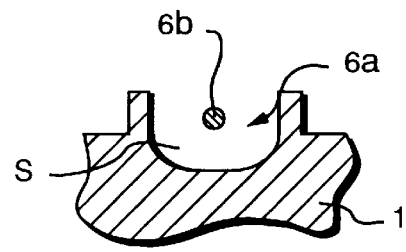
FIG. 5 is a cross sectional view of the transmission line taken on line A—A of FIG. 4A.

Being formed on the inner wall of the case in this manner, the transmission line 6 offers the following advantages. The thickness of the conductive rod 6b can be freely changed. Referring to FIG. 5 showing a cross section taken on line A—A, each transmission line has a layer S of air between the conductive rod 6b and the inner wall of the groove 6a, which serves as the outer conductor. This structure only has a small transmission loss so that the transmission line is capable of coping with currents of high amperes. The structure also allows adjustment of the high-frequency characteristics of the transmission line by moving the dielectric block 7 along the groove.

Figure 6:
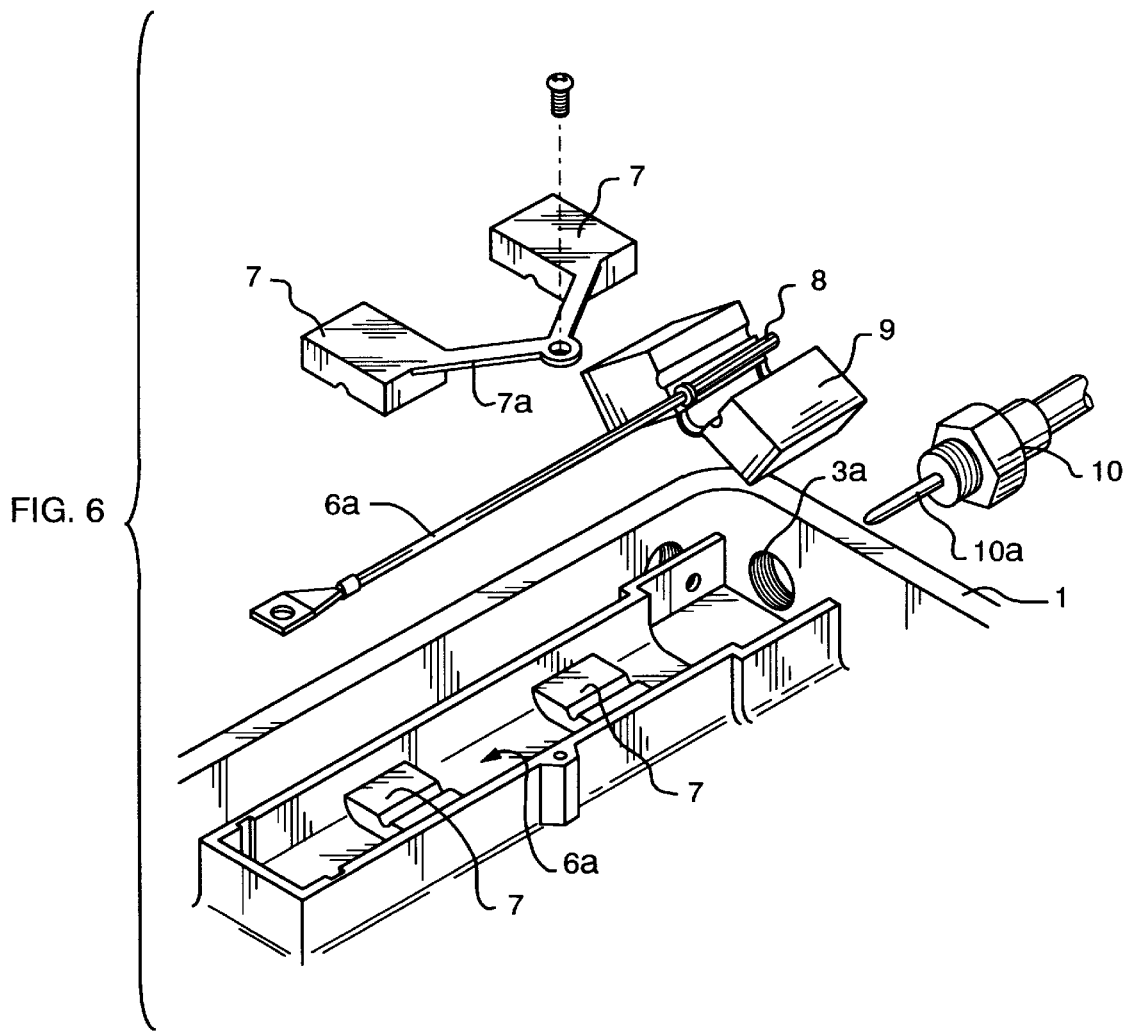
FIG. 6 shows an alternate transmission line 6 of the embodiment.

The preferred material of the dielectric block 7 is Jurakon (a brand name; manufactured by Polyplastics Corporation). Alternatively, the block may be made of some other synthetic resin with similar electrical characteristics. Depending on the application, the dielectric block 7 may be fixed in the groove 6a so as not to be slidable. Furthermore, as shown in FIG. 6, a plurality (for example, two as shown) of the dielectric blocks may be fixed in each groove 6a. As illustrated, each of the blocks 7 may be divided into two sections with the two upper sections connected by an arm 7a, so that the upper blocks can be easily mounted in the groove by securing the arm 7a to the housing 1 with a screw.

Also, a split tube 8 with a slit is secured to one end of the dielectric block 7. The split tube 8 is held in a grip block 9 in the cable connecting portion 3 (2, 4). The grip block 9 is made of two pieces connected by a hinge. A support groove 9a is formed in the split surface of each piece. Furthermore, a block securing recess 9b which is formed integrally with the groove 6a is provided in the cable connecting portion 3 on the inner surface of the housing 1.

Figure 7:
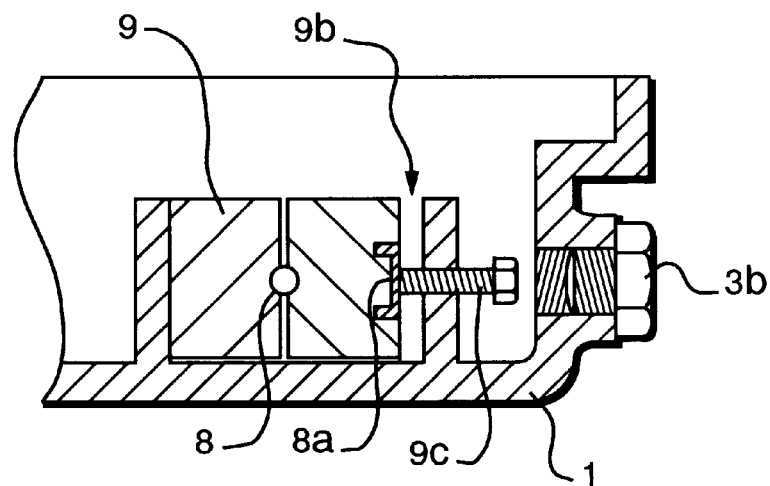
FIG. 7 is a cross sectional view of the transmission line taken on line A—A of FIG. 4A.

For assembly, as shown in FIG. 7 illustrating a cross section taken on line B—B, the split tube 8 is held in the support grooves 9a by fitting the two pieces together. Then, the block 9 is positioned in the block securing recess 9b and secured by a screw 9c at its side.

Then, a connector 10 attached to one end of a transmission cable is tightened into the cable insertion hole 3a (2a, 4a) while inserting a pin 10a into the split tube 8. Finally, the screw 9c is tightened to firmly and securely connect the pin 10a with the split tube 8 in the grip block 9.

As shown in FIG. 7, a metal abutment plate 8a is mounted on the grip block 9 where the screw abuts against the block to prevent cracking or deformation of the grip block . In addition, the abutment plate 8a allows the pressure of the screw 9c to be distributed over the entire length of the grip block 9. It should be noted that when the blind bolt 3b (2b, 4b) is removed, the screw 9c can be tightened from the outside of the distribution apparatus through the screw access hole.

Reference numeral 11 is a mother board having a pair of transmission terminals 12 on its rear face and a pair of relay terminals 13 on its front face. The transmission terminals 12 are spaced apart so as to correspond with the main line connection terminals 5a and 5b (or 5b and 5c). Each of the transmission terminals 12 is connected to a relay terminal 13 via a high-frequency passing circuit 14 with a capacitor 14a interposed therein. The circuits 14 allow high-frequency signals to pass therethrough. The two transmission terminals 12 are connected to each other by a current transmission circuit 15 with a coil 15a interposed therein. The current transmission circuit 15 is also protected with a cover.

Also, the housing 1 has a plurality of guide pins 16 projected therefrom while the mother board 11 has a plurality of guide holes 17 formed therein corresponding to the guide pins 16. The mother board 11 is mounted in the housing 1 by inserting the guide pins 16 into the guide holes 17. In this way, the transmission terminals 12 are easily aligned and brought into contact with, for example, the main line connection terminals 5a and 5b, although these terminal are not visible behind the mother board 11 during mounting. Then, the mother board 11 is secured to the housing 1 with a pair of screws 18.

Also, the mother board 11 has a pair of screws 22a tightened through the transmission terminals 12 to firmly secure the terminals 12 to the main line connection terminals 5b (5a, 5c).

Figure 8:
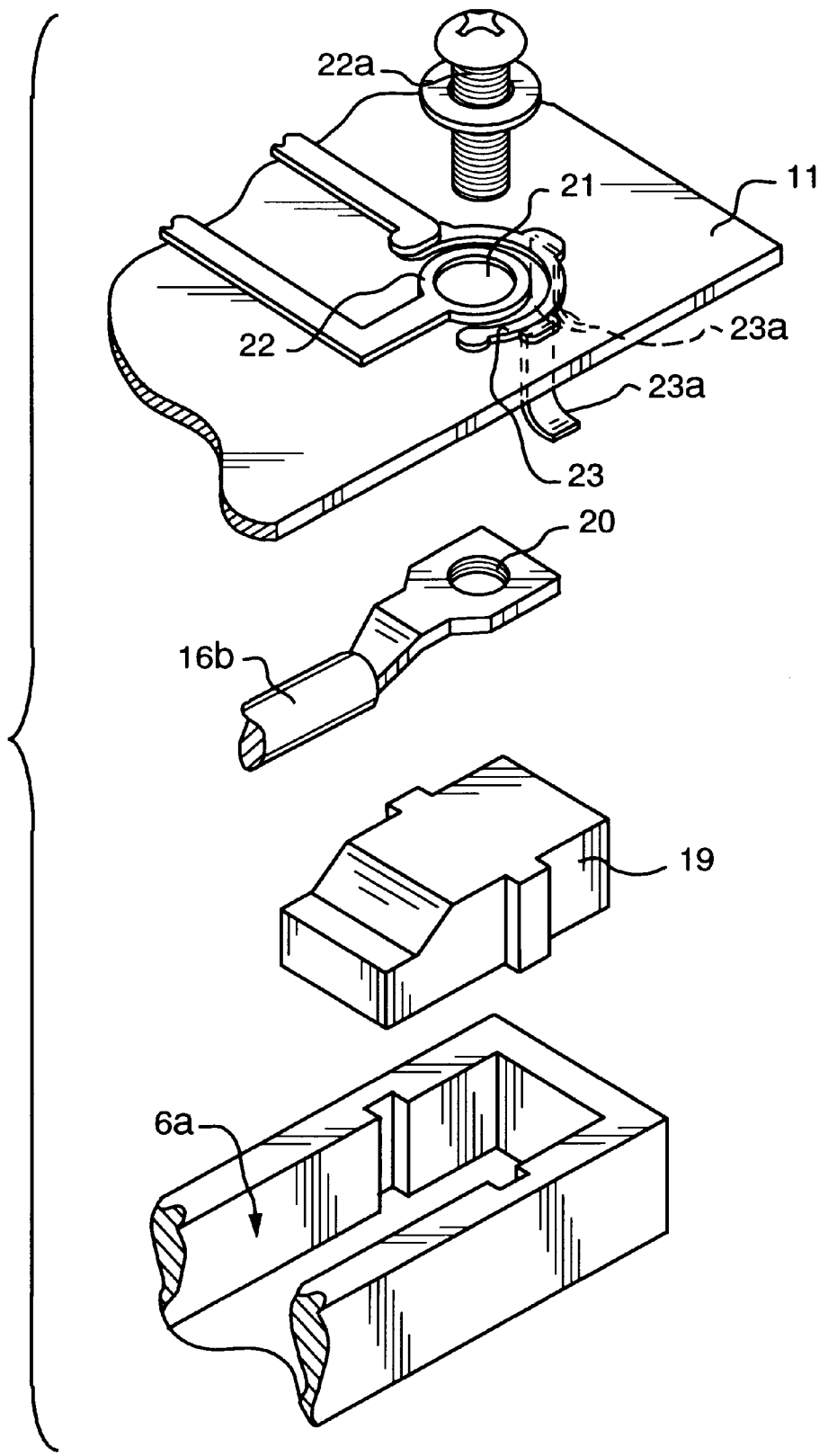
FIG. 8 shows the main line connection terminal of the embodiment.

Referring to FIGS. 4A and 4B, each of the main line connection terminals 5a, 5b, and 5c includes a resin support piece 19 provided at one end of the groove 6a and an end portion of the conductive rod 6b placed on the support piece 19. The end portion of the rod 6b has a threaded hole 20 formed therein. As shown in FIG. 8, the transmission terminal 12 includes a first land 22 surrounding a screw hole 21 in the mother board 11. The screw 22a is tightened in the threaded hole 20 of the main line connection terminal 5b, thereby bringing the head of the screw 22a into firm contact with the first land 22a and establishing an electrical connection between the first land 22 and the conductive rod 6b. It should be noted that the support piece 19 is optional and can be omitted.

Figure 9:
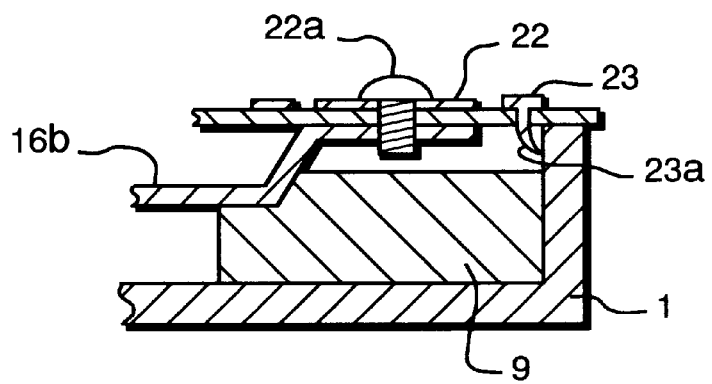
FIG. 9 is a cross sectional view illustrating how the main line connection terminal is connected to the mother board.

Provided outside the first land 22 is a circular second land 23 with a portion cut out of it. The second Land 23 is insulated from the first land 22 and electrically connected to the housing 1 via contact pieces 23a projected from the rear surface of the mother board 11. Thus, the main line connection terminal 5b (5a, 5c) is coaxially connected to the transmission terminal 12 (see FIG. 9).

Also, the mother board 11 has a pair of engaging slits 14 formed therein outside the relay terminals 13.

Reference numeral 25 designates a box-shaped branch unit which has on one surface a pair of connection terminals 26 and 26' which correspond to the relay terminals 13 of the mother board 11. The branch unit 25 has on the opposite surface a branch terminal 27. The connection terminals 26 and 26' and the branch terminal 27 are connected to a built-in branch circuit. With the connection terminal 26 serving as the input terminal and the connection terminal 26' serving as the output terminal, the branch unit 25 can convey high-frequency signals in a predetermined direction. It also has on both ends thereof two engaging claws 28 projected toward the surface where the connection terminals 26 and 26' are located. When the branch unit 25 is mounted on the mother board 11 by engaging the claws 28 with the slits 24, the connection terminals 26 and 26' are brought into contact with the relay terminals 13.

The branch unit on the mother board may be mounted by other methods. For example, the engaging claws formed on the branch unit may be replaced with guide lugs which are inserted into the slits formed in the mother board.

Furthermore, screws or clips may be employed as the means of mounting the branch unit on the mother board.

The mother board 11 is provided with a push switch 29. When the branch unit 25 is mounted on the mother board 11, the outer surface of the branch unit 25 presses against and turns off the switch 29. When the branch unit 25 is detached from the board mother 6, the push switch 29 is released from the pressure of the unit 25 and turned on, thus short-circuiting the relay terminals 13 and allowing passage of high-frequency signals between the transmission terminals 12.

Moreover, the current transmission circuit 15 of the mother board 11 ensures that currents and high-frequency signals flow between the transmission terminals 12 whether or not the branch unit 25 is mounted on the mother board 11.

Reference numeral 30 is a tap board mounted on the inner surface of a main body 31. Together with the housing 1, the main body 1 constitutes the entire case of the distribution apparatus. The tap board 30 includes a distributing circuit and four external taps 32 exposed on the outer surface of the main body 31. The external taps 32 serve as distribution output terminals. The tap board 30 also has on its inner surface an input terminal 33 corresponding to the branch terminal 27 of the branch unit 25. Additionally, the housing 1 is provided with a current passage contact 34 which is connected to the cable connecting portion 3 while the main body 31 is provided with another current passage contact 35 which is connected to the distributing circuit. Therefore, currents can be transmitted through these two contacts. The current passage contact 34 is connected to the external taps 32 via a current passage network 36 provided on the tap board 30. By fitting the main body 31 on the housing 1, the branch terminal 27 is brought into contact with the input terminal 33. At the same time, an electrical contact is also established between the current passage contacts 34 and 35, thereby forming a separate current passing route from the high-frequency passing route.

Figure 10:
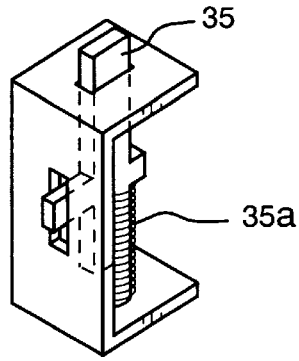
FIG. 10 shows the current passage contact of the embodiment.
Figure 11A:
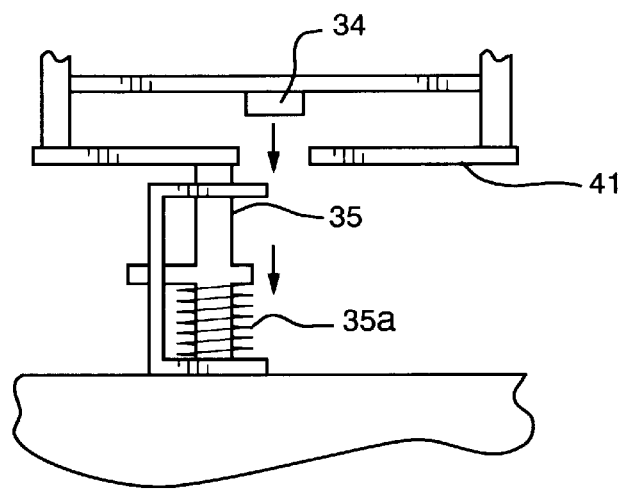
FIGS. 11A and 11B shows the current passage contact in two states.
Figure 11B:
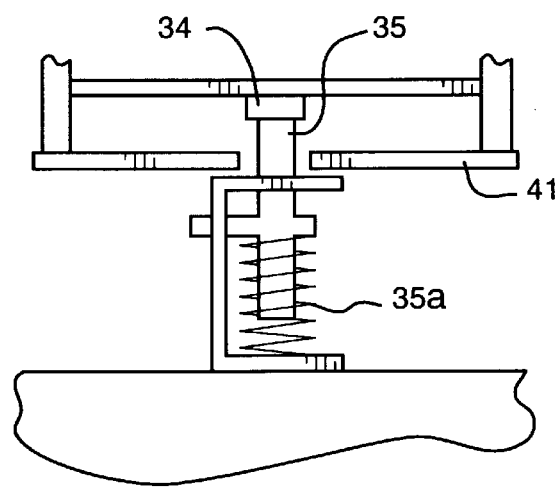

As shown in FIG. 10, the current passage contact 35 is of a pin type biased toward the tip thereof by a coil spring 35a. The current passage contact 35, if shifted off the insertion-type current passage contact 34, moves back while compressing the coil spring 35, thus preventing breakage (see FIG. 11A). However, when the housing 1 is moved with respect to the main body 31 to align the two contacts, the contact 35 projects forward to establish an electrical contact (see FIG. 11B).

A positive thermistor 37 (model name: Polyswitch RXE0675; manufactured by Reikem) is interposed between the contact 35 and each distribution output terminal via a connector 38 in the current passage network 36. The positive thermistors 37 can be easily coupled to and detached with a single motion from the connectors 38 (model name: VH series connector; manufactured by Nippon Solderless Terminal Corporation).

The right and the left fitting ends of the housing 1 and the main body 31 have different shapes so that the housing and the body can be assembled in only one way. Assembly is possible only when a lug 39 projected from the housing 1 is inserted into a groove 40 formed in the main body 31. In this way, whenever the housing and the body are assembled, left-to-right inverted assembly is prevented while a secure electrical contact is established between the current passage contacts 34 and 35.

The current passage contact 34 is connected to the split tube of the cable connecting portion 3 via a current passage cable 34a. Normally, the upper surface of the current passage contact 34 is covered with a protection plate 41 which has a terminal insertion hole 41a to prevent the worker from accidentally touching the contact 34 and receiving an electric shock while at work.

Figure 12A:
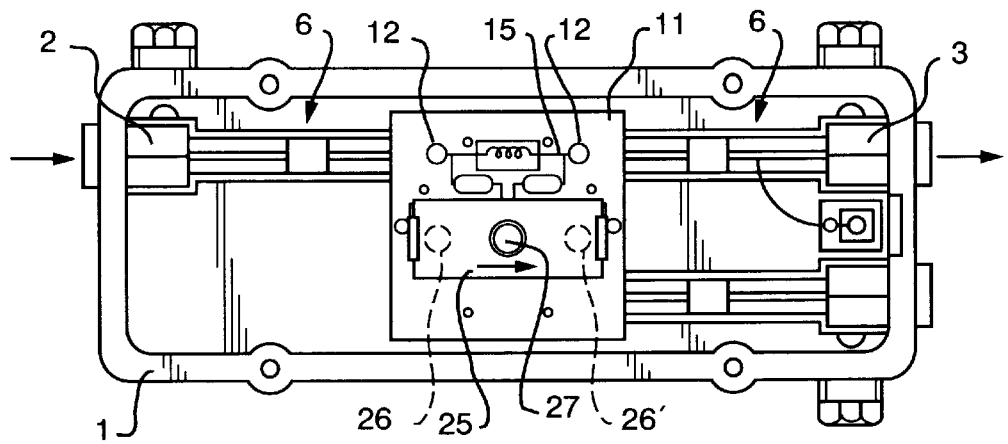
FIGS. 12A, 12B, and 12C show different pairs of cable connecting portions.

As shown in FIG. 12A, the multi-tap distribution apparatus can be used as an aerial type device if the branch unit 25 is mounted on the mother board 11 with the terminal 26 on the same side as the cable connecting portion 2 and the terminal 26' on the same side as the cable connecting portion 3. In this case, the cable connecting portion 2 is used as the input terminal while the cable connecting portion 3 is used as the output terminal.

Figure 12B:
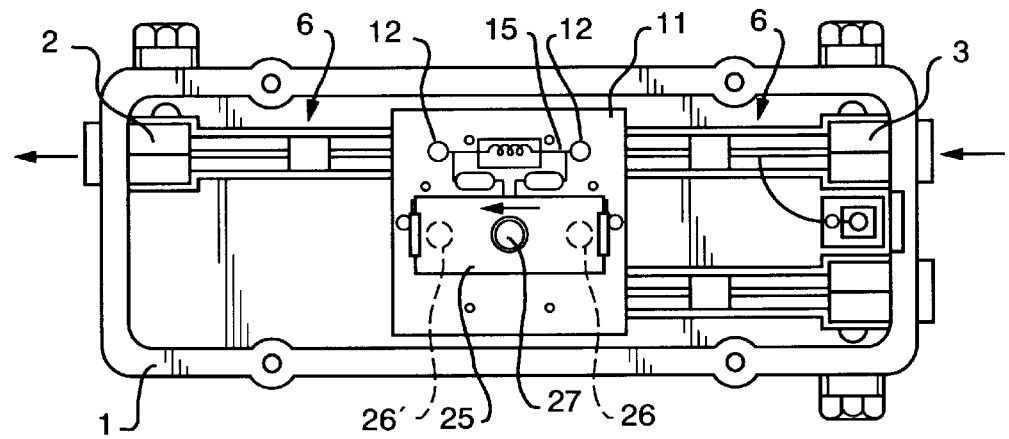

The positions of the input and output terminals can be easily reversed by detaching and horizontally rotating the branch unit 180 degrees and mounting it back on the mother board 11 (see FIG. 12B).

Figure 12C:
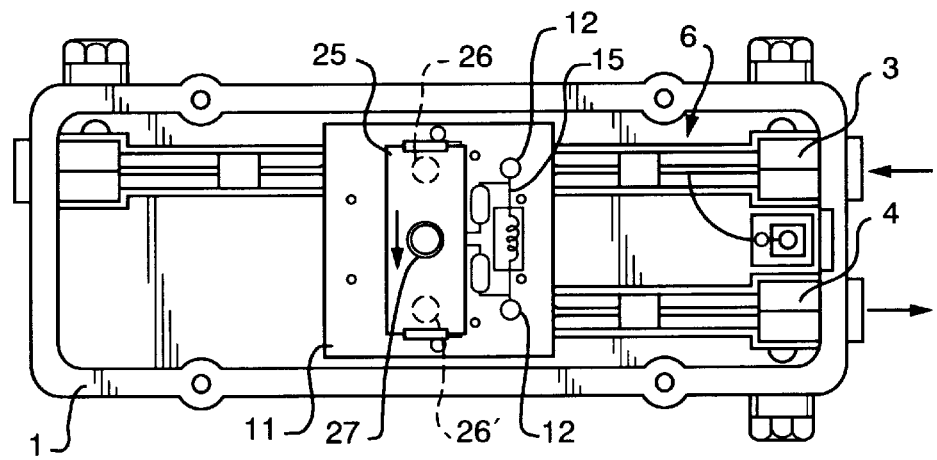

To use the multi-tap distribution apparatus as a pedestal type device, the mother board 11 is detached and rotated 90 degrees in clockwise direction as shown in FIG. 12C, so that the connection terminals 26 and 26' are connected with the main line connection terminals 5b and 5c via the transmission terminals 12. In this application, the cable connecting portion 3 serves as the input terminal and the cable connecting portion 4 as the output terminal. The positions of the input and output terminals can be easily reversed as in the aerial type application: by detaching and rotating the branch unit 25 one hundred and eighty degrees and mounting it back on the mother board 11 (this position is not shown).

To change the number of branches (secondary cables), the main body 31, the tap board 30, and the branch unit 25 are replaced with a different main body incorporating a tap board having a desired number of taps and a different branch unit.

To perform such a replacement, the branch unit 25 can be easily detached by disengaging the claws 28 from the slits 24. Upon detachment of the branch unit 25, the switch 29 is turned on, thus short-circuiting the transmission terminals 12 and maintaining high-frequency signal transmission between the cable connecting portions. Accordingly, the high-frequency signal transmission remains uninterrupted while the branch unit 25 is replaced.

In this embodiment, different cable connecting portions can be selected for use as the input and output terminals by rotating the mother board 90 degrees. Also, the number of taps can be increased or decreased by replacing the branch unit and the main body. Not only does this construction improve the operability of the multi-tap distribution apparatus, but it also allows the multi-tap distribution apparatus to be used as an aerial or pedestal type. Moreover, the multi-tap distribution apparatus offers the advantage of maintaining the check function from a remote site even when the branch unit or the main body is removed since the transmission of the currents and the high-frequency signals from the input side to the output side remains uninterrupted.

If the transmission cable is used as a telephone line, telephone conversations are not interrupted by using the current transmission circuit and the telephone line as the telephone uses signals in the low-frequency range.

If a short circuit occurs on the distribution output terminal side, the resistance of the positive thermistor included in the current passage network increases from tenths of an ohm to several kilo ohms, thus blocking the current flow between the cable connecting portion and the distribution output terminal. This protects the circuits in the distribution apparatus while preventing damage to equipment and devices connected to the transmission cable. This structure can be safely used in applications where currents of 15 amperes or more are conveyed.

As explained above, the high-frequency transmission circuit (branch circuit) is installed separately from the current passage network and a positive thermistor is connected to each distribution output terminal. Therefore, if a short circuit occurs, the current flow is interrupted only to the concerned branch output terminal while maintaining transmission of the television signals.

Since a positive thermistor is detachably connected to each external tap, it is possible to leave installed the positive thermistors for the external taps connected to the subscribers using telephone lines for receiving CATV services. Meanwhile, the power supply can be easily stopped to non-subscribers by removing from the connectors the positive thermistors for the external taps which are connected to non-subscribers. Not only can this operation be simply done but also it is easy to recognize to which externals taps currents are carried.

Alternatively, the same result can be obtained by providing switches (not shown) in the current passage network and selectively turning on and off the switches instead of detaching positive thermistors as explained above.

Furthermore, the multi-tap distribution apparatus may have only two cable connecting portions instead of three as in this embodiment. Furthermore, the number of taps may be either increased or decreased; the main body may have any number of taps.

As described above, the embodiment includes three main line connection terminals on the inner surface of the housing. Two of the terminals are located above and on both sides of the center of the housing while the third terminal is located directly under one of the upper terminals. Accordingly, the pair of main line connection terminals of the mother board to be connected with the transmission terminals can be selected by rotating the mother board. Instead of this construction, equally spaced pairs of main line connection terminals may be arranged on the housing so that the transmission terminals are connected to any desired pair of main line connection terminals by shifting the mother board. However, the present invention is applicable to the types of models in which main line connection terminals cannot be selected for connection or the number of external taps cannot be changed.

If only protection of the components and equipment from short circuits is desired, only one positive thermistor needs to be interposed in the current passage network near the main line connection terminal.

Figure 13A:
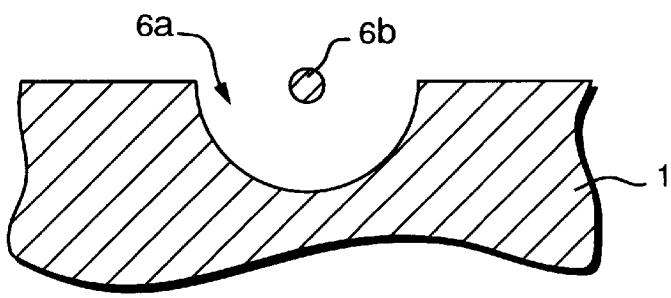
FIGS. 13A, 13B, and 13C show examples of modified transmission lines.
Figure 13B:
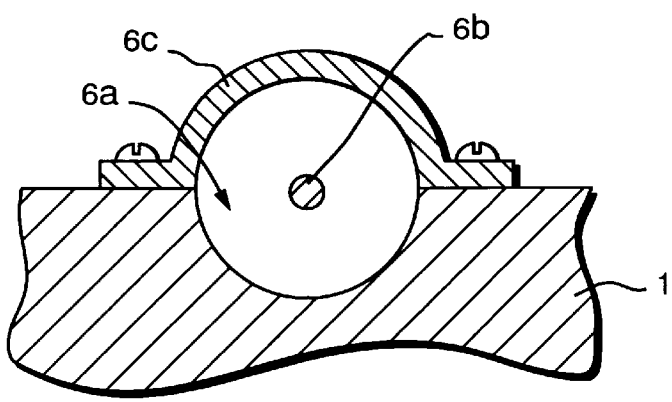
Figure 13C:
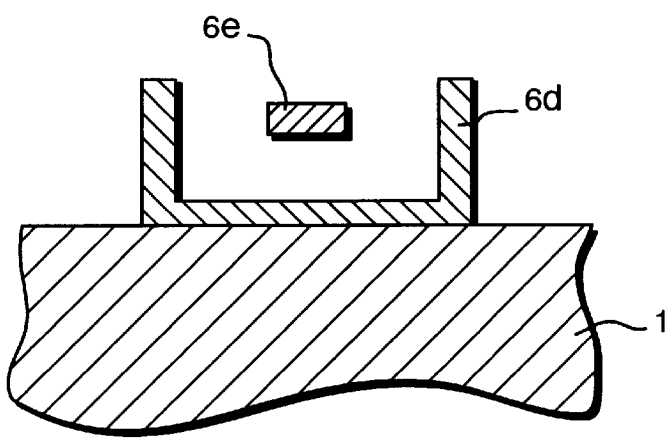

Other modifications are possible within the scope of the present invention. For example, as shown in FIG. 13A, the shield walls may be eliminated from the side walls of the groove 6a. Also, a metal cover 6c may be mounted over the groove 6c to increase the shield factor as shown in FIG. 13B. Although the groove 6c should be integrally formed with the housing to minimize the manufacturing cost, a separately manufactured member having an angular cross section may be secured to the housing 1 as shown in FIG. 13C. Furthermore, the cross section of the groove 6c does not have to be semi-circular. As shown in FIG. 13C, the transmission line may be composed of a groove with an angular cross section and a metal bar 6e in place of the conductive rod 6b.

In the embodiment, the transmission cable is connected to transmission lines via connectors at cable connecting portions. However, the transmission lines may be directly connected to cable connection portions to which the transmission lines are connected.

EFFECT OF THE INVENTION

According to the invention, each transmission line is constructed by forming a groove integrally with the inner wall of the housing. The transmission line, thus being part of the inner wall, takes up only small space in the case. This structure provides a layer of air between the central conductor and the outer conductor (the inner wall of the groove) so as to conduct currents with large current values without causing a large transmission loss.

According to the present invention, a desired pair of cable connection portions can be selected as the input and output terminals.

Also, the present invention allows adjustment of the high-frequency characteristics of each transmission line by moving the dielectric block along the groove.

If the cross section of the groove is semi-circular as in the preferred embodiment, the thickness of the layer of air becomes even around the central conductor. If a conductive rod is used as in the embodiment, large currents can be conveyed in a suitable manner.

I claim:

1. A distribution apparatus for being interposed in a transmission cable, said distribution apparatus comprising,
a built-in mother board disposed in the approximate center of a case, said mother board including,
a branch circuit for distributing as output signals high-frequency signals received at an input terminal of said mother board,
a current transmission circuit for allowing currents to be transmitted between said input terminal and an output terminal of said mother board, and
said input and output terminals of said mother board being electrically connected to cable connecting portions provided on at least one end of said case by means of transmission lines each having a central conductor, said central conductor of each transmission line being disposed along a groove formed on the inner surface of said case without being in contact with the inner wall of said groove.

2. The distribution apparatus in accordance with claim 1 wherein at least three cable connecting portions are provided so that two cable connecting portions are selectable from said at least three cable connecting portions so as to be connected to said input and output terminals of said mother board.

3. The distribution apparatus in accordance with claim 1 wherein each of said grooves has a semi-circular cross section.

4. The distribution apparatus in accordance with claim 1 wherein said central conductor of each transmission line is a conductive rod with a split tube on one end thereof, for having a connector pin inserted therein and being fixed, together with said connector pin, in the cable connecting portion.

5. The distribution apparatus in accordance with claim 1 further comprising a dielectric block interposed between each of said transmission lines and the corresponding groove, said dielectric block occupying part of said groove so as to be movable along said groove or to be fixed in a predetermined position in said groove.

6. The distribution apparatus in accordance with claim 2 wherein each of said grooves has a semi-circular cross section.

7. The distribution apparatus in accordance with claim 2 wherein said central conductor of each transmission line is a conductive rod with a split tube on one end thereof, for having a connector pin inserted therein and being fixed, together with said connector pin, in the cable connecting portion.

8. The distribution apparatus in accordance with claim 3 wherein said central conductor of each transmission line is a conductive rod with a split tube on one end thereof, for having a connector pin inserted therein and being fixed, together with said connector pin, in the cable connecting portion.

9. The distribution apparatus in accordance with claim 6 wherein said central conductor of each transmission line is a conductive rod with a split tube on one end thereof, for having a connector pin inserted therein and being fixed, together with said connector pin, in the cable connecting portion.

10. The distribution apparatus in accordance with claim 2 further comprising a dielectric block interposed between each of said transmission lines and the corresponding groove, said dielectric block occupying part of said groove so as to be movable along said groove or to be fixed in a predetermined position in said groove.

11. The distribution apparatus in accordance with claim 3 further comprising a dielectric block interposed between each of said transmission lines and the corresponding groove, said dielectric block occupying part of said groove so as to be movable along said groove or to be fixed in a predetermined position in said groove.

12. The distribution apparatus in accordance with claim 6 further comprising a dielectric block interposed between each of said transmission lines and the corresponding groove, said dielectric block occupying part of said groove so as to be movable along said groove or to be fixed in a predetermined position in said groove.

13. The distribution apparatus in accordance with claim 4 further comprising a dielectric block interposed between each of said transmission lines and the corresponding groove, said dielectric block occupying part of said groove so as to be movable along said groove or to be fixed in a predetermined position in said groove.

14. The distribution apparatus in accordance with claim 7 further comprising a dielectric block interposed between each of said transmission lines and the corresponding groove, said dielectric block occupying part of said groove so as to be movable along said groove or to be fixed in a predetermined position in said groove.

15. The distribution apparatus in accordance with claim 8 further comprising a dielectric block interposed between each of said transmission lines and the corresponding groove, said dielectric block occupying part of said groove so as to be movable along said groove or to be fixed in a predetermined position in said groove.

16. The distribution apparatus in accordance with claim 9 further comprising a dielectric block interposed between each of said transmission lines and the corresponding groove, said dielectric block occupying part of said groove so as to be movable along said groove or to be fixed in a predetermined position in said groove.

* * * * *